United States Patent [19]

Roschier

[11] Patent Number: 4,742,549
[45] Date of Patent: * May 3, 1988

[54] PROCEDURE FOR WATCHING OVER THE AREA IN FRONT OF A LIFT

[75] Inventor: Nils-Robert Roschier, Vantaa, Finland

[73] Assignee: Elevator GmbH, Baar, Switzerland

[*] Notice: The portion of the term of this patent subsequent to Jul. 7, 2004 has been disclaimed.

[21] Appl. No.: 784,642

[22] Filed: Oct. 4, 1985

[30] Foreign Application Priority Data

Oct. 5, 1984 [FI] Finland ............................ 843923

[51] Int. Cl.$^4$ ............................................ G06K 9/00
[52] U.S. Cl. ........................................ 382/1; 187/104; 307/116; 340/550; 340/562
[58] Field of Search ............... 340/550, 552, 561, 562, 340/568, 579, 825.37; 307/116, 125; 49/25, 28, 31; 324/77 B, 77 E, 78 R; 342/166, 179; 187/104; 382/1

[56] References Cited

U.S. PATENT DOCUMENTS

| | | | |
|---|---|---|---|
| 3,370,677 | 2/1968 | Federmann | 187/104 |
| 3,743,058 | 7/1973 | Diamond | 187/104 |
| 3,845,843 | 11/1974 | Cohen | 187/104 |
| 3,973,208 | 8/1976 | Diamond | 340/562 |
| 4,326,197 | 4/1982 | Evin | 340/552 |

Primary Examiner—Leo H. Boudreau
Assistant Examiner—Jose L. Couso
Attorney, Agent, or Firm—Browdy & Neimark

[57] ABSTRACT

A procedure for watching over the area in front of a lift door, of said area being formed with the aid of one-dimensionally or two-dimensionally grouped photoelectric image point pick-ups, image signals suitable to be digitally processed, with a pick-up signal preprocessing means based on mutual interaction of the image points. With a view to obtaining a lift door monitoring system with good resolution in a wide lighting range, the design taught by the invention contains, at least, the following features for processing the pickup-specific image signals:

(a) transformation of the image signal current to a voltage dependent on its logarithm, (b) conversion of the above-mentioned voltage to a first pulse signal, (c) combining the pulse signals of the different channels with an interaction network and supplying the resulting channel-specific signals to an electric charge pump for forming a second pulse signal of which the frequency is, over the interaction network dependent on the ratios between the frequencies of the other channels' first pulse signals, and (d) sensing the differences between the frequencies of the channel-specific second pulse signals for resolving the relative changes in intensity of the object being imaged.

11 Claims, 4 Drawing Sheets

PROCEDURE FOR WATCHING OVER THE AREA IN FRONT OF A LIFT

BACKGROUND OF THE INVENTION

The present invention concerns a procedure and means for watching over the area in front of a lift door, of said area being formed a one-dimensional or two-dimensional image with the aid of an image-forming means based on interaction between the image points.

Endeavours have long been pursued to supplement the operation of the traditionsl photocell on a lift door by other auxiliary apparatus. It is understood that a photocell is normally able to monitor only persons passing through the door opening but not, for instance, lift passengers who are approaching the door opening. Watching over the whole door area is clearly advantageous because then the door will not close in the face of approaching lift passengers, and on the other hand the door can be closed with shorter delay than previously.

Watching over the door area can be implemented with pick-ups of various types, e.g. with ultrasound radar, Doppler radar and thermal radiation pick-ups. So far, apparatus of these types has been little employed. The reasons are to be found in the high price, considering that the means is not indispensable in view of the lift's operation, although it elevates the quality level of service. In lift applications particularly great embarrassment is also imminent if the means is excessively sensitive or if detection still persists some time after a disturbance has disappeared.

OBJECT OF THE INVENTION

It has to be noted that for investments in lift auxiliaries of the type mentioned to be worthwhile, they should be inexpensive and reliable; furthermire, time saving regarding the open times of the lift door should be achieved. It is quite as important from the viewpoint of the lift's capacity to minimize the open times of the lift door and the interference factors as to observe an approaching passenger and to keep the door open for him/her. In this respect, apparatus of this type differs e.g. from the door opening mechanisms of department stores, the principal task of which is to open the door for customers.

In the same applicant's U.S. Pat. No. 4,679,032 is disclosed a practicable design for producing an image based on contrast separation. Therein, the image signals obtained from image-forming points elicit in image-forming channels an electric current which indirectly influences the current going to the channel and the voltage at a point in the circuit called the tapping point, in such manner that their product is proportional to the image signal current. The output of image forming is a frequency which is proportional to the current, and desired contrast heightening is accomplished by externally supplying an appropriate current into the interaction network interconnecting the tapping points of a plurality of image-forming channels.

The present invention concerns a procedure and means for watching over the door area of a lift in which the drawbacks of the designs of prior art are extensively eliminated, and which is based on the above-mentioned image-forming principle, described in U.S. Pat. No. 4,679,032.

SUMMARY OF THE INVENTION

The watching procedure of the invention is mainly characterized in that the procedure contains, at least, the following processing steps of the pickup-specific image signals, in the separate image-forming channels:

(a) transformation of the image signal current into a voltage dependent on its logarithm;

(b) conversion of said voltage into a first pulse signal of which the frequency depends on the magnitude of said voltage;

(c) combining the pulse signals of the different channels with an interaction network and feeding the channel-specific signals resulating from such combination to an electric charge pump for forming a second pulse signal in a manner known in itself, the frequency of said second pulse signal being over the interaction network dependent on the mutual ratios of the other channels' first pulse signals; and (d) sensing the differences between the frequencies of the channel-specific second pulse signals for separating the relative intensities of the object that is being imaged.

The logarithmic transformation has the advantage that a remarkably wide operating range of the image point pick-ups is achieved because the principle of the present procedure implies reaction to intensity of illumination on a logarithmic scale. Moreover, with the aid of the logarithmic transformation it becomes feasible to examine, instead of absolute values, a certain ratio between the illumination values of two points, which is constant independent of the absolute illumination values. For instance, illumination 4 on channel A and illumination 2 on channel B yields the ratio A/B=2, and when the lighting intensity increases to be e.g. 100-fold (A=400, B=200), the ratio A/B is still 2, while the difference A-B has changed to be 100-fold. Therefore detectors based on differential illumination values cannot operate under widely changing lighting conditions.

The logarithmic transformation, utilized as taught by the invention, has the further advantage that the sensitivity of the apparatus decreases in logarithmic proportion when the lighting intensity increases, and vice versa. This is in the system of the present invention a fully "built-in" characteristic, which shall be more closely described later on.

Since the foundation of the application taught by the invention is the electric charge pump known through the above-cited U.S. Pat. No. 4,679,032, most advantageously supplied with pulses in which only the frequency is variable, the first step is to form pulses of the log-converted and amplified voltage which have a frequency depending on the magnitude of the voltage. This can be done by employing the same circuit design as in electric charge pumps, without interaction network.

With the aid of a capacitor, the voltage pulses are converted into current pulses by which the voltage at the interaction point of the electric charge pump is influenced, applying technology known in the art. The voltage at the interaction point and the current, if any, coming from the interaction network constitute in combination the supply current of the electric charge pump, which reflects the momentary image perceived by the image point pick-ups. In this case, the interaction points of the image-forming channels are all interconnected in star fashion with the aid of capacitances, whereby the "image" primarily consists of information as to which pick-up or pick-ups have experienced changes, if any, with reference to the others.

The interaction network has another important task. Owing to its construction, it endows the image-forming means with an adaptive feature, which is indispensable for eliminating the variable background image and for obtaining reliable operation. Adaptivity is in general understood to mean that in the course of time the reaction of any given member to a disturbance diminishes until the reaction has ceased altogether although the disturbance is still present. Since the interaction network is composed of capacitances connected together, the small additional current induced in the image-forming channel disappears rather swiftly as the differential voltages between the capacitances tend to level out. It is to be understood that the persons striving to enter the lift are moving towards the lift, cause a delay of the lift door closing action and enter the lift. It would be needless to wait long for a person who stands on one spot, and it is therefore to advantage if an object which has remained substantially immobile is no longer taken into consideration after a while. The adaptive feature in itself is a known matter, but it is applicable in the solving of the present problem at many points.

An advantageous embodiment of the procedure of the invention is characterized in that the logarithmic transformation of the image signal current is accomplished by observing the voltage which is established across a resistor and which is proportional to the logarithm of the ratio of two currents, where through a first diode is conducted a substantial part of the image signal current and through a second diode is conducted a reference current compensating for the variations of the circuit elements' characteristics, and where the said voltage is amplified before forming the first pulse signal.

The so-called diode equation is: $I = I_o(\exp(U/Ut) - 1)$; where $I$ = the current passing through the diode, $I_o$ = a constant depending on the diode, $U$ = the voltage applied across the diode, $Ut$ = a temperature-dependent factor.

Observing the voltage U, it is readily found that it depends directly on the logarithm of I when $I >> I_o$. Therefore the logarithm converter is easy to implement with the aid of diodes even though the transformation, accomplished in this way, is not fully exact. However, the inaccuracy does not give rise to any significant detriment, as will be seen later on.

An advantageous embodiment of the procedure of the invention is characterized in that a given number of pulses of said second pulse signal are counted channel-specifically with pulse counters, starting simultaneously so that when the counter of the highest frequency channel has stopped a second counter is started, which is allowed to count until the counter of the lowest frequency channel stops, at which time the result in said second counter is compared with a given decision threshold indicating high enough relative intensity of the light that has appeared in the image area, the result of comparison thus obtained serving as instruction to the lift door opening mechanism for closing the door or continuing to keep it open.

It is obvious that counting the pulses arriving from the different image-forming channels and comparison of the counting rates, or pulse frequencies, can be accomplished in a multitude of ways. In the means of the invention a simple and inexpensive design solution has been employed.

The means for watching over the area in front of a lift door applying the procedure of the invention, comprising photoelectric image point pick-ups grouped for producing a one-dimensional or two-dimensional image and connected into pickup-specific image signal preprocessing channels which are based on electric charge pumps producing an image signal suited to be digitally processed and which are in mutual interaction, is characterized in that each image signal processing channel comprises, at least:

(a) an image signal current logarithmic transformer by the aid of which said current can be transformed into a voltage depending on its logarithm, (b) a voltage/frequency converter by the aid of which a first pulse signal having a frequency dependent on the magnitude of said voltage can be produced, (c) a two-stage electric charge pump known in itself in the art in which the first stage consists of a modulating circuit for the first pulse signal and of an interaction point by mediation of which the image signal processing channel of the image signal is connected to the other equivalent channels, and the second stage of a frequency oscillator, the second pulse signal formed by it having a frequency which over the interaction network is dependent on the mutual ratios of the frequencies of the first pulse signals of the other channels, and (d) means for counting the frequency of said second pulse signal, for resolving the relative intensity changes of the object being imaged.

An advantageous embodiment of the means of the invention is characterized in that the output of the means has been connected to the lift door control system so that the open time of the lift door can be prolonged, when required, on the basis of the image information obtained.

Other advantageous embodiments of the procedure of the invention are characterized by that which has been stated in the claims following below.

BRIEF DESCRIPTION OF THE DRAWINGS

The invention is described more closely in the following with the aid of an example, referring to the drawings attached, wherein.

DESCRIPTION OF THE PREFERRED EMBODIMENT

Figure 1:
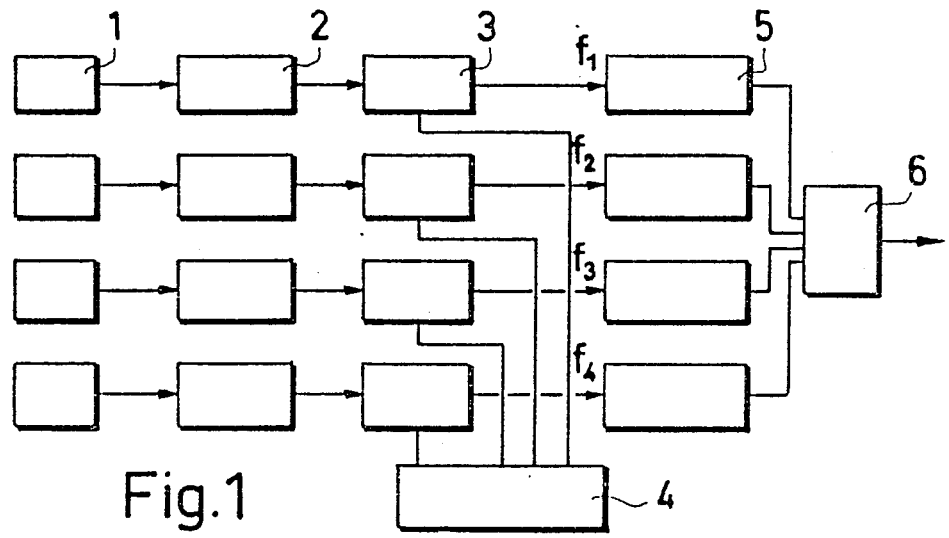
FIG. 1 presents a block diagram of the system of the invention, in an embodiment with four channels.

In FIG. 1 is presented a watch system according to the invention, with four channels, comprising phototransistors 1 serving as image point pick-ups, logarithmic transformation and matching units 2 for the phototransistor signal, interaction elements 3 with their tapping points 3a, an interaction impedance network 4 with constant current supply arrangements, pulse counter logics 5, and a detection circuit 6, the output signal of the latter acting in the lift door control system.

Figure 2:
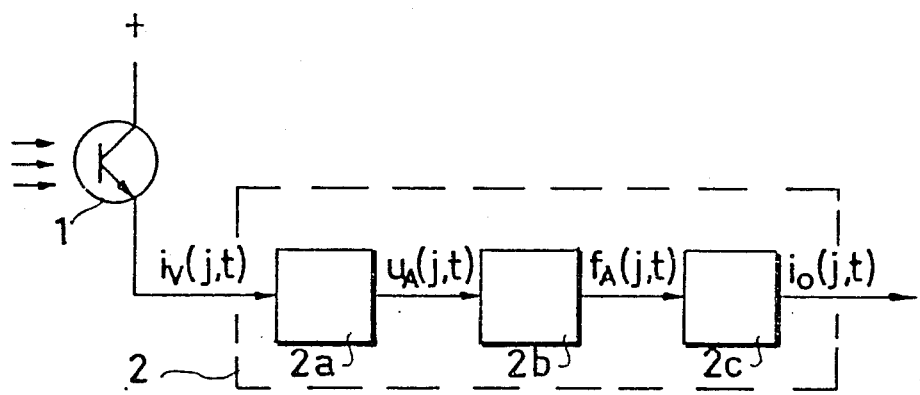
FIG. 2 presents part of a channel of FIG. 1, in greater detail.

In FIG. 2 is presented a more detailed block diagram of the construction of the logarithmic transformation and matching unit 2 as regards one channel. In the diagram have been entered the variables between different blocks, dependent on time t, of the channel j. The image signal current $i_v(j,t)$ from the phototransistor 1 is carried to the logarithmic transformation and amplifying unit 2a. The output of this unit is the voltage $$U_A(j,t) = K_A * \ln(i_v(j,t)/i_r), \qquad (1)$$

where $K_A$ is a constant and $i_r$ the reference current, which shall be described more closely later on. The voltage acts on the voltage/frequency converter 2b, whereby its output is a frequency $$f_A(j,t) = K_B * U_A(j,t) \quad (K_B = \text{constant}) \qquad (2)$$

depending on its magnitude. The block 2c constitutes a matching unit for the interaction element 3 so that the current $i_o(j,t)$ is generated within the element 3 by electric charge transfer with the aid of the capacitor $C_o$. Then, $$i_o(j,t) = C_o * U_o * f_A(j,t), \qquad (3)$$

where $U_o$ is the amplitude of the pulses (constant). The amplitude is in this connection understood to be the peak-to-peak value of the pulses. The ultimate result from the preprocessing of the current of the phototransistor 1 for the input of the interaction element 3 will be:

$$i_o(j,t) = C_o * U_o * K_B * K_A * \ln(i_v(j,t)/i_r)$$

We may write $C_o * U_o * K_B * K_A = K_C$, whereby $$i_o(j,t) = K_C * \ln(i_v(j,t)/i_r) \qquad (4)$$

Figure 3:
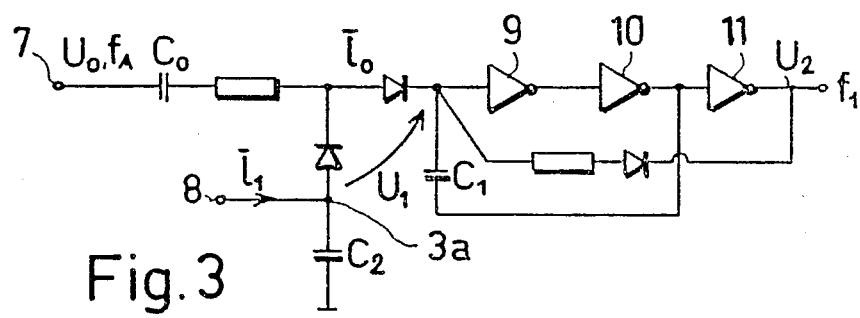
FIG. 3 presents the circuit diagram of the basic unit of an interaction element.

The basic circuit taught by the invention may be defined as a two-phase system with its inputs and outputs related to each other in a certain way (FIG. 3). In U.S. Pat. No. 4,679,032, mentioned above, practical quantities such as current, voltage and frequency at the inputs and outputs have been used to demonstrate the relationships in the basic circuit. Therefore the demonstration thereof shall not be repeated in this connection, but its operation in the embodiment of the present invention is briefly described in the following.

The circuit diagram of the interaction element is presented in FIG. 3. The circuit has two inputs: the signal input proper, 7, and the input of the interaction network, 8. Independent of the embodiment, the task is to form of the input quantities current signals which in desired proportion charge the capacitor C1. In this case, the image signal comprises a constant amplitude pulse sequence (the "first pulse signal"), which has a variable frequency $f_A$ in accordance with the light which the image point pick-up perceives. The current signal $i_o$ is produced with the capacitor $C_o$, from which current pulses are discharged. Together with the current $i_1$ coming through the interaction point, $i_o$ constitutes a current which has the mean value $\bar{i}_o$ and with which electric charge is pumped at frequency $f_A$ into the capacitor C1 (Equation (3)).

The two-phase operation of the interaction element 3 is implemented in that the input quantity $i_o$ acts on the product of the intermediate tapping point voltage $U_1$ and the current $i_1$ only, not directly on the value of the output $f_1$. The output $f_1$ is directly proportional to the current $i_1$ according to the formula $$f_1(j,t) = k_1 * \bar{i}_1(j,t) \qquad (5)$$

where $\bar{i}_1$ is the mean of the current $i_1$ over one period. When the tapping point is connected with an impedance together with the tapping points of the circuits operating in parallel, interaction is set up between the voltage $U_1$ and the current $i_1$:

$$U_1(j,t) * \bar{i}_1(j,t) = k_o * \bar{i}_o(j,t) \qquad (6)$$

By mediation of this interaction, the current $i_1$, and at the same time the output frequency $f_1$, changes in accordance with formula (5).

Figure 4:
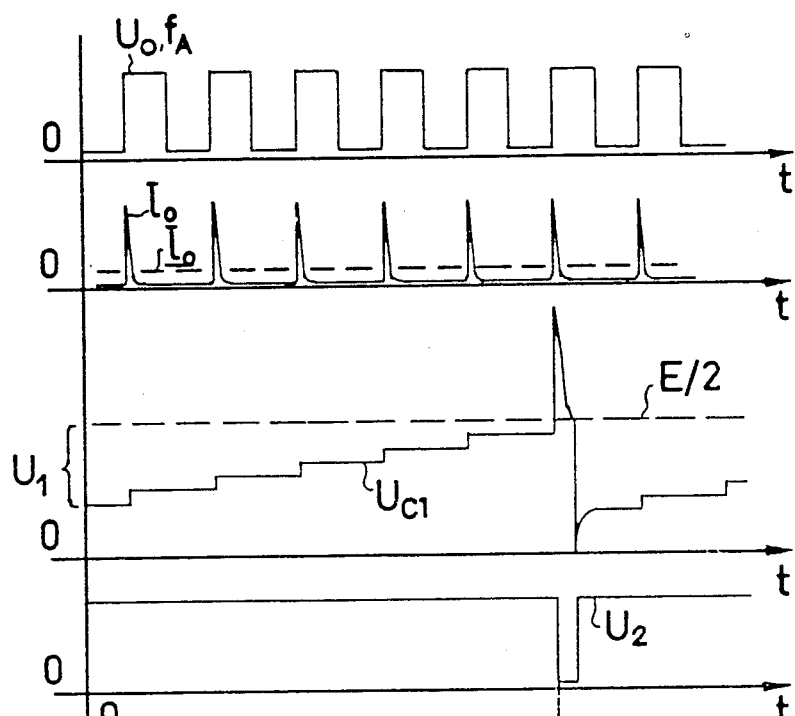
FIG. 4 illustrates the operation of the element of FIG. 3.

In FIG. 4 has been depicted the operation of the circuit as in the interaction element 3. (The diode threshold voltages have been disregarded and it has been assumed that $U_o >> U_1$.) The voltage supply of the CMOS circuits 9, 10 and 11 (e.g. of NOT type) is E, and the decision threshold of the circuits is assumed to be E/2. The voltage $U_1$ is then the differential voltage between the decision threshold and the capacitor C2.

By the current $\bar{i}_o$, the capacitor C1 is filled up to decision threshold in the time $$t_1 = (C1 * U_1)/\bar{i}_o \qquad (7)$$

After this time, $t_1$, C1 is discharged with the aid of the CMOS circuits, thereby delivering the charge $$Q = C1 * E, \qquad (8)$$

whereafter it is once more charged through the diodes to a level which is below the decision threshold by the amount $U_1$, when a new period starts. In this way pulses are formed which have the frequency $f_1 = 1/t_1$. The pulses, which thus now also contain the information supplied by the interaction network, constituting the "second pulse signal", have most appropriately a constant amplitude U2 directly suited to be digitally processed.

Figure 5:
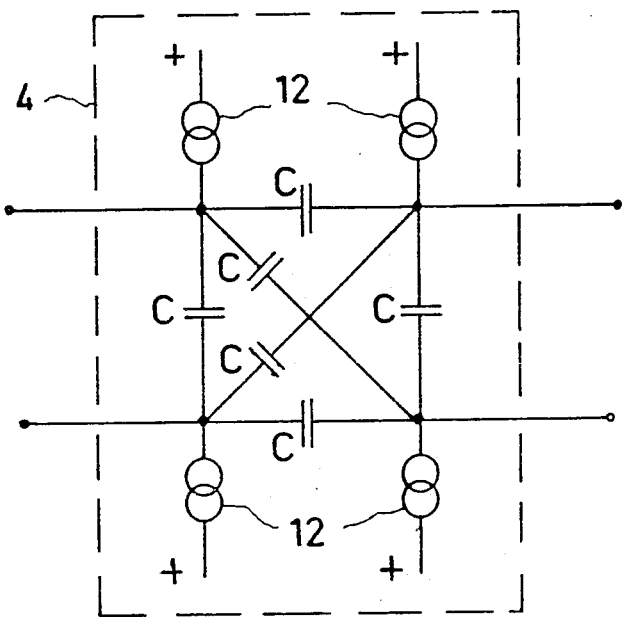
FIG. 5 presents an interaction network circuit applicable in an embodiment according to the invention, FIG. 6 displays different curve shapes in the image information preprocessing channel.

In the following, let us consider the theoretical background of the invention when the interaction network consists of a capacitive system as shown in FIG. 5, for a four-channel embodiment. The capacitances C are capacitors of equal size. The base current of the interaction network, or the "idling current", is supplied to all four channels by current generators 12.

Since the analytic expression, as a function of the input quantity $i_o(j,t)$, of the output frequency $f_1(j,t)$ of the electric charge pump leads to non-linear equations, the nature of the interaction between the different image-forming channels has been approximately described in the following.

The image-forming channels are tuned to be equivalent by removing the interaction capacitors C. Then, $i_1(j,t) = $ constant, whence follows that the voltage $U_1(j,t)$ at the interaction point directly follows the logarithm of the value of the input current $i_v(j,t)$. In circuits operating in actual practice, the great and rapid changes of $i_v$ are only visible as short transients at frequency $f_1$, whereby the output frequency without interaction network can without major error be asserted to be constant, that is, $f_o$. The constant current source 12 of each channel is tuned so that every channel has the same constant frequency $f_o$.

The interaction between channels caused by the capacitors C reflects the changes of the input currents $i_v(j,t)$ onto the output frequencies of the channels as follows: $f_1(j,t) = f_o + f_1(j,t)$. If further changes take place in the input current, the $f_1$ component gradually vanishes (adaptation). Let us assume that at the time $t = t_1$ equilibrium prevails in our four-channel exemplary system, i.e., $i_v(1,t) \ldots i_v(4,t)$ are constant. We shall further, in order to make the equations shorter, introduce the following notations for the quotients, which are substantially constant in this situation: $i_v(1,t_1)/i_r \ldots i_v(4,t_1)/i_r = A1 \ldots A4$. We find then from equations (4) and (6) that $$U_1(j,t_1) = (K_E/I) * \ln Aj \qquad (9)$$

where $K_E = k_o * K_C$, $I = i_1(j,t_1)$ which is constant at the time $t_1$. Thus, when plotted on a semilogarithmic scale, this relationship indicates a linearly ascending voltage along the linear $U_1$ vertical axis, to which is joined a logarithmic $i_v$ horizontal axis.

Figure 6:
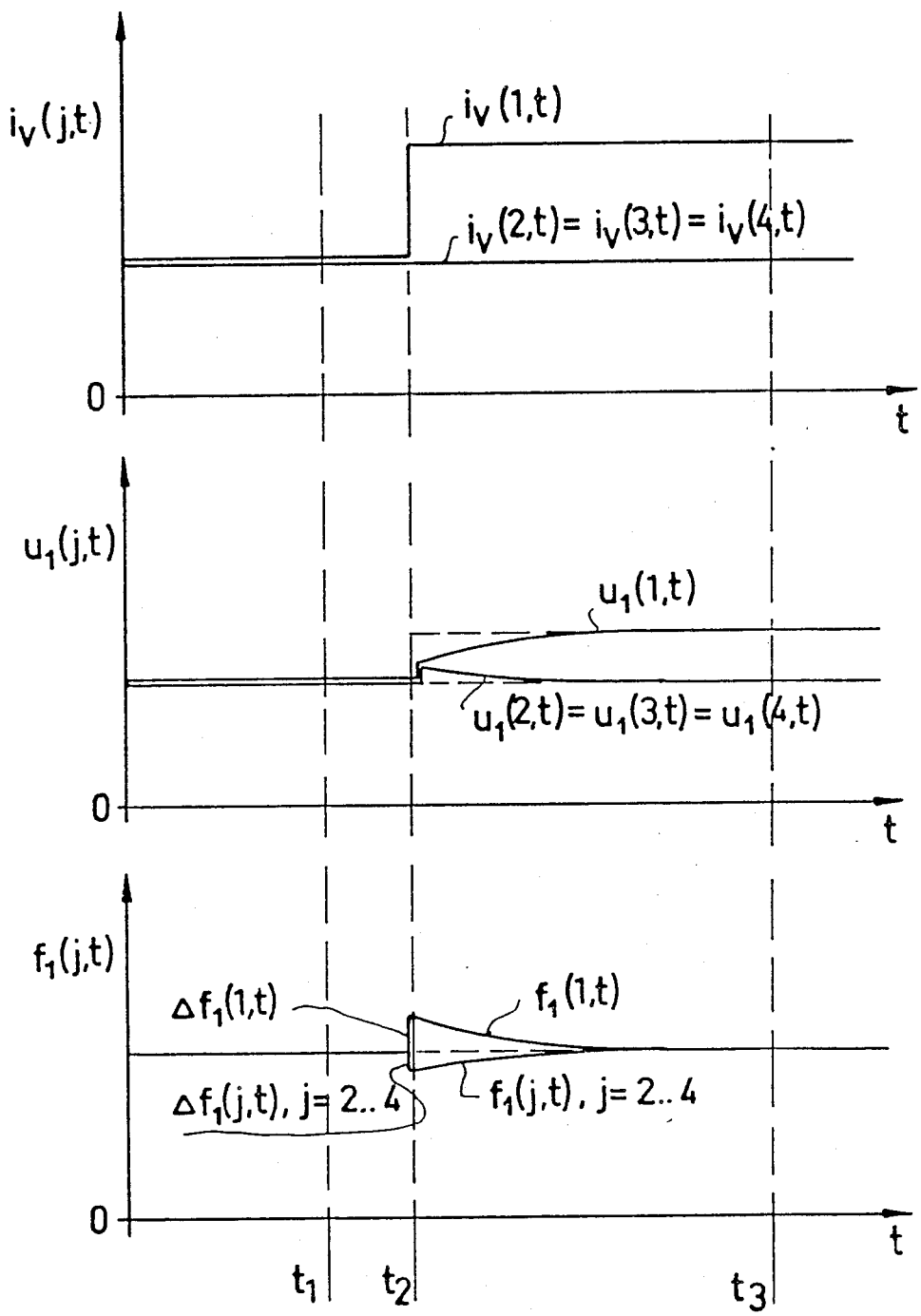

Next let us assume that for instance $i_v(1,t)$ at the time $t_2$ gets a new value, while the other input currents $i_v(1,t) \ldots i_v(4,t)$ remain unchanged. Since all channels communicate with the other channels by equal-sized capacitors C, the change of the voltage $U_1$ in channel 1 is immediately reflected to the voltages $U_1(j,t)$ of the other channels (FIG. 6). At time $t_3$, a new equilibrium position has been gained, the average change of the different channels being then calculable on the basis of $\Delta \underline{U}_1(t_2) = \underline{UHD}\ 1(t_3) - \underline{U}_1(t_1)$. Substituting formula (9) in this, we obtain $$\Delta \underline{U}_1(t_2) = K_E/I \left( \frac{1}{4} \sum_{j=1}^{4} \ln A'j - \frac{1}{4} \sum_{j=1}^{4} \ln Aj \right),$$

whence by the aid of the logarithmic calculation formulae:

$$\Delta \underline{U}_1(t_2) = K_E/I * \ln([(A'1*A'2*A'3*A'4)/(A1*A2*A3*A4)]^{0.25}) \qquad (10)$$

where $A'j$ represents $i_v(j,t_3)/i_r$. For our further considerations we shall denote with B the term in angular brackets [ ].

Combining the formulae (4), (5) and (6) and the condition $k_o * K_C = K_E$ of formula (9), we find for the output frequency at time $t_2$:

$$f_1(j,t_2) = k_1 * K_E * \ln(i_v(j,t_2)/i_r)/(U_1(j,t_1) + \Delta \underline{U}_1(t_2)) \qquad (11)$$

Since according to FIG. 6 we have assumed that no changes occur after $t = t_2$, we find $i_v(j,t_2) = i_v(j,t_3)$. Hence follows (formulae (9) and (10)):

$$U_1(j,t_1) + \Delta U_1(t_2) = K_E/I * \ln(Aj * B^{0.25}).$$

Substituting this in (11) and solving equation (11) for the frequency differential that has been produced, we find:

$$\Delta f_1(j,t_2) = f_1(j,t_2) - f_o = f_o * \ln(A'j/Aj * (1/B)^{0.25})/\ln(Aj * B^{0.25}), f_o = k_1 * I \qquad (12)$$

The system of the invention aims exactly at observation of this kind of frequency differentials $\Delta f_1(j,t)$. By calculating the frequencies of all channels, they can be mutually compared and a quantity $\Delta T$ can be produced which is the differential between the maximum and minimum of the counting times:

$$\Delta T = Tj(\text{max}) - Tj(\text{min})$$

This quantity is employed in the present invention towards ultimate detection and decision-making, as follows:

The limit value $f_1(j,t_2) * Tj + f_o * Tj = N$ is formed, where N is the constant number of pulses (we assume that $f_1(j,t)$ is constant after the time of change $t_2$). We may then write $Tj = N/(\Delta f_1(j,t_2) + f_o)$.

$\Delta T$ is calculated on the basis hereof, and certain simplifications are carried out, the meanings of the Aj and A'j terms are reintroduced, and equation (13) is used for detection of the frequency differentials; and we obtain $$\Delta T = \frac{N}{f_o} * \frac{\ln[(i_v(j,t_2)/i_v(j,t_1))\text{max}/(i_v(j,t_2)/i_v(j,t_1))\text{min}]}{\ln\left[\left(\frac{4}{\pi} \sum_{j=1}^{4} i_v(j,t_2)\right)^{0.25} / i_r\right]} \qquad (13)$$

As can be seen from equation (13), no factor dependent on the input circuits is present in the solution for $\Delta T$, provided that the different channels have the same gain factor. Dependence in this respect is not critical other than regarding $f_o$, which however is adjustable independent of the input circuits. The errors induced by the approximations which were made are smallest when $i_v(j,t_2)$ is at least 2 to 3 times greater than $i_r$ and when the ratio of the input currents, $i_v(j,t_2)/i_v(j,t_1)$ is moderately low: 1.1 to 2.

$\Delta T$, defined by equation (13), is an approximate limit value which fails to account for the effects of the channels' adaptation and also for the rate of change of the input signal and the dissimultaneity of the changes in different channels. If the rate of change of the input image is fast enough compared with the adaptation constant, the approximation will be accurate enough for practical purposes, bringing to the fore the system's most central signal processing properties.

The term $$\left(\frac{4}{\pi} \sum_{j=1}^{4} i_v(j,t_2)\right)^{0.25}$$

represents the order of magnitude of the currents $i_v(j,t_2)$ (their geometric mean), in other words, owing to this term the sensitivity of the system follows the level of general lighting and compensates, partly at least, for the weaker contrast under dim lighting; similarly, no oversensitivity will be encountered in bright lighting.

A change of contrast sufficient to prolong the lift door open time is detected when $Nd \geq Nt$, where $Nt$ is a predetermined fixed number and $Nd = f_d * \Delta T$, where $f_d$ is an adjustable frequency (sensitivity adjustment).

Figure 7:
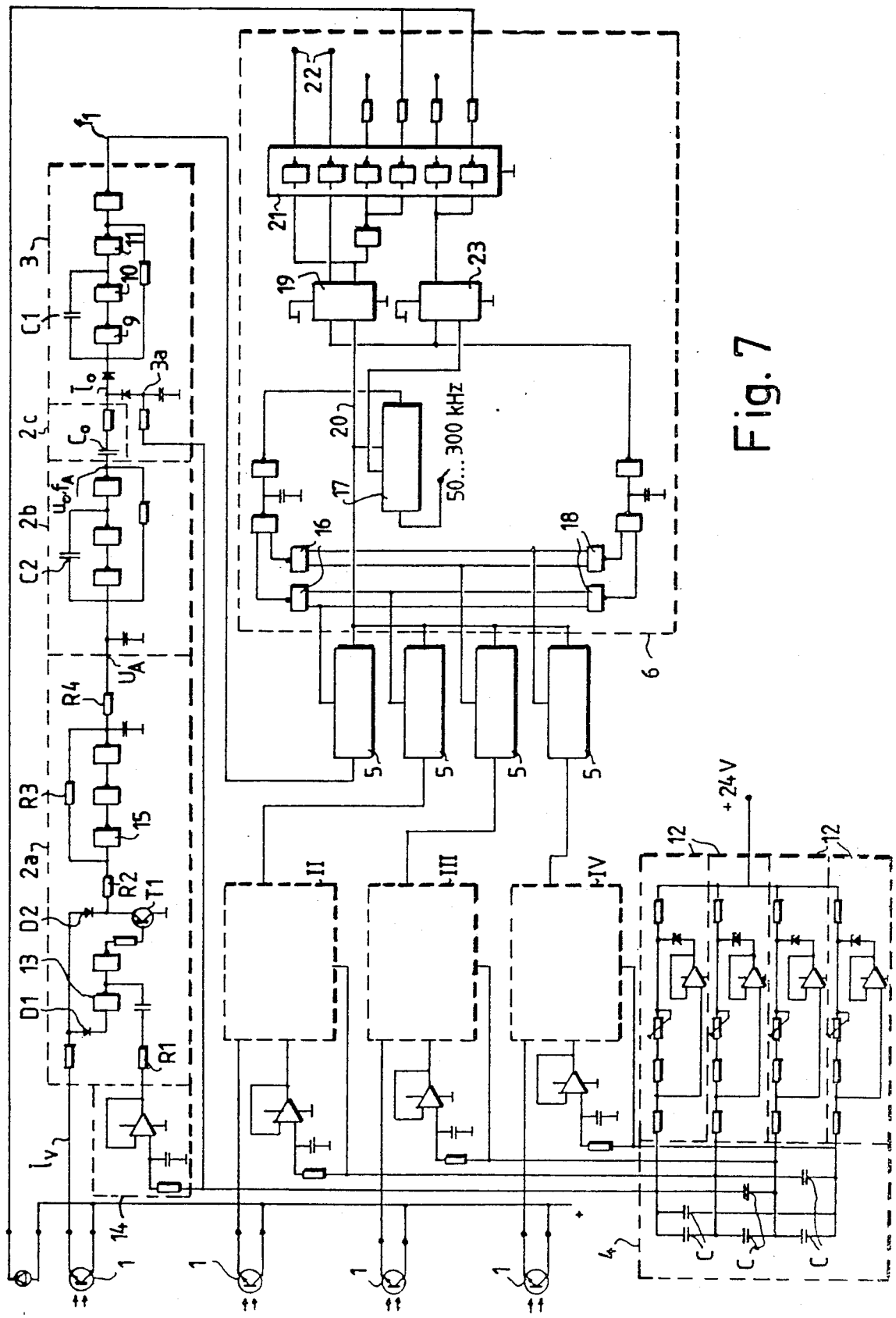
FIG. 7 presents the circuit diagram of the means of the invention.

In FIG. 7 is presented an exemplary circuit for the means of the invention and which shall be briefly reviewed in the following, using as aid the results of the model solution just gone through.

Image forming starts at the phototransistors 1 operating as image point pick-ups, and of which there are four in this four-channel example circuit. The phototransistor produces the current $i_v$ which is conducted to the pair of diodes D1 and D2 located in the logarithmic transformation and amplifying unit 2a. The cathode of the diode D1 is accurately at the potential of the decision level of the NOT circuit 13, which is typically E/2. The voltage level is maintained with the transistor T1. Through D1 passes a certain current $i_r$, which is controlled with the circuit 14. The task of the circuit 14 is to reduce the voltage across R1 for reducing $i_r$ if the values of $i_v$ become very small. This is because it has been found that otherwise the linear relationship of formula (9) is strongly angulated at the lowest currents still representing the usable measuring range. Some compensation of the errors present in the logarithmic transformation is also hereby achieved.

The greater part of the image signal current $i_v$ is conducted to the diode D2, the voltage building up across this being dependent on the logarithm of the current. Since the terminal of resistor R2 connected to the first NOT gate 15 of the amplifier is likewise accurately maintained at the potential of the gate's decision level (all NOT gates of any one channel have to be processed on one silicon chip so that adequate accuracy of operation might be achieved if common, inexpensive CMOS circuits are used), the voltage building up across the resistor conforms with sufficient accuracy to the equation $U_{R2}=k^*(\ln i_v - \ln i_r)$. The diodes D1 and D2 should be as closely equal as possible; differences between them may be compensated by adjusting the resistance value of R1.

The voltage $U_{R2}$ is further amplified in the block 2a to become the voltage $U_A$. The gain factor is established in well-known manner by the ratio of resistors R3/R4. The current produced by the voltage $U_A$ charges the capacitor C2 of the voltage/frequency converter 2b until it is discharged with the aid of the NOT gates, causing pulses to appear at frequency $f_A$ at the converter's output. The amplitude, i.e., the peak-to-peak value, of the pulses is constant, $U_o$. The block 2c, which is a matching unit containing the input capacitance $C_o$ for the next stage, and the block 3, which is the electric charge pump of interaction element, operate as has been described in connection with FIGS. 3 and 4, and the reference numerals are the same as in said figures. The interaction network with capacitors C and constant current generators 12 has been assembled in a separate block 4. The blocks 2a, 2b, 2c and 3 of the other three channels have been omitted from the figure in the interest of simplicity; they are represented by the blocks II, III and IV.

The counter circuits 5 record the channel-specific pulse frequencies $f_1$ by counting N pulses. In the circuits carried out in practice, N has been 256. The counter circuits 5 report to the gates in the detector circuit block 6 when they have completed their count; the branch commencing with NOR gates 16 records when the fastest-counting counter 5 has finished, and the branch commencing with NAND gates 18 records the time at which all counters 5 have finished. The finishing of the first counter 5 sets to zero the counter 17, which begins to count up to the number Nt; this too has been 256 in practice. The count takes place at a far higher frequency than the counting of N. Typically, $f_o$ has been fixed at 3.75 kHz when the clock frequency of the counter 17 is 50 to 200 kHz. This range constitutes, at the same time, the sensitivity adjustment range between the clock frequency of the counter 17 is the same as $f_d$ (see farther below).

In case no additional passengers are approaching the lift doors, the $f_1$'s arriving at the counters 5 are not significantly different. In that case the counters terminate their counting nearly simultaneously. The counter 17 then has no time to count very far before the information arriving through the gates 18 gives notice that all counters 5 have stopped. This datum lodges itself in the input of the RS swing as logical zero. The line 20, indicating finishing of the counter 17 (Nt=256) both sets to zero the counters 5 for a new counting cycle and clocks the flip-flop 19, whereby information regarding persons in front of the lift door is forwarded to the NOT gate unit 21. The gate outputs 22 go to the lift door control system; the others control the LED components required in checking and maintenance operations on the apparatus. Checking and maintenance operations are also served by another RS flip-flop 23, which is identical with the flip-flop 19 as to its function, but only affects the LEDs at the time when Nt=128, i.e., one half of the decision threshold.

In case more passengers are approaching the lift door, the counters 5 terminate their counts at different times. If the image field of a given phototransistor has significantly darkened, the counter 5 in the respective channel will count more slowly than the other counters, and vice versa. If the counter 17 has time enough to count up to NT=256, that is, up to the decision threshold, it will clock the flip-flop 19 with its input being logical 1. When this information starts onward from the terminals 22 to the lift door control system, causes a delay in the closing of the lift doors so that the arriving passenger can catch the lift.

Finally, let us consider the detection threshold needed in practice at different values of $i_v$ (typical values are 1 to 5 $\mu A$). We assume that $f_o=3.75$ kHz
$f_d=100$ kHz
$i_v=2.0$ $\mu A$ (input current of all channels is on the order of 2 $\mu A$)
$i_r=0.1$ $\mu A$
ratio of change required for detection=x It is then possible, based on the equation (13), to set up the approximate inequation: $3.75/100 \leq \ln X/\ln 20$, whence follows that $x \geq 1.12$, i.e., a relative change about 12% is sufficient for detection. Similarly, with the same assumed values, we find the requisite change to be about 16% when $i_v$=abt. 5 $\mu A$, and about 6% when $i_v=0.5$ $\mu A$ (very low lighting). Thus, the change required for detection at a given sensitivity setting is smaller at low lighting level, and this partly compensates for the lower constrast under weak lighting, while on the other hand there is no risk of over-sensitivity in bright lighting.

It is obvious to a person skilled in the art that different embodiments of the invention are not confined to the example presented in the foregoing and that, instead, they may vary within the scope of the claims following below.

I claim:

1. A procedure for watching over the area in front of a lift door, of said area being formed with the aid of one-dimensionally or two-dimensionally grouped photoelectric image point pick-ups, from which image signals suitable to be digitally processed are obtained, with a pick-up signal preprocessing means based on mutual interaction of image points from the image point pick-ups, wherein the procedure contains at least the following processing steps of the image signals, in separate image forming channels:
  (a) transformation of a current of the image signal to a voltage dependent on its logarithm,
  (b) conversion of the above-mentioned voltage to a first pulse signal, of which the frequency depends on the magnitude of said voltage.
  (c) combining the pulse signals of the different channels with the aid of an interaction network and supplying the resulting channel-specific signals to an electric charge pump for forming a second pulse signal in a manner known in itself in the art, the frequency of said second pulse signal being over the interaction network dependent on the ratios between the frequencies of the other channels' first pulse signals, and
  (d) sensing the difference between the frequencies of the channel-specific second pulse signals for resolving relative changes in intensity of the object being imaged.

2. Procedure according to claim 1, wherein the logarithmic transformation of the image signal current is carried out by observing the voltage building up across a resistor, which is proportional to the logarithm of the ratio of two currents, through a first diode being conducted a substantial part of the image signal current, and through a second diode being conducted a reference current compensating for the variations of the circuit elements, and said voltage being amplified before forming the first pulse signal.

3. Procedure according to claim 1, wherein a current of an interaction point is formed with the aid of the currents from channel-specific constant current sources belonging to the interaction network and of interaction currents passing through all capacitances.

4. Procedure according to claim 1, wherein a given number of pulses of said second pulse signal is counted channel-specifically with pulse counters starting simultaneously so that after the counter of the channel with the highest frequency has finished another counter is started, and which is allowed to count pulses up to the finishing of the counter of the channel with the lowest frequency, when the result in said second counter is compared with a given decision threshold indicating a large enough relative change in intensity of the light that has appeared in the imaging area, said result of comparison serving as instruction for a lift door opening mechanism to closing the door or to continue to keep it open.

5. Procedure according to claim 1, wherein the watch over the area in front of the lift door a lift door closing system is influenced so that on the basis of the image information received an open time of the lift door is prolonged as required.

6. A device for watching over the area in front of a lift door, said means comprising photoelectric image point pick-ups grouped for producing a one-dimensional or two-dimensional image, connected to pickup-specific image signal preprocessing channels based on electric charge pumps in mutual interaction and producing an image signal suited for digital processing, wherein each image signal processing channel comprises at least:
  (a) an image signal current logarithmic transformer by the aid of which said current can be transformed into a voltage depending on its logarithm,
  (b) a voltage/frequency converted by the aid of which a first pulse signal having a frequency dependent on the magnitude of said voltage can be produced.
  (c) a two-stage electric charge pump known in itself in the art in which the first stage consists of a modulating circuit for the first pulse signal and of an interaction point by mediation of which the image signal processing channel of the image signal is connected to the other equivalent channels, and a second stage of a frequency oscillator, the second pulse signal formed by it having a frequency which over the interaction network dependent on mutual ratios of the frequencies of the first pulse signals of the other channels, and
  (d) means for counting the frequency of said second pulse signal, for resolving relative intensity changes of the object being imaged.

7. A device according to claim 6, wherein the image signal current logarithmic transformer comprised in the means consists of a pair of diodes connected in parallel with reference to the current, of control circuits for the currents passing through said diodes and by which a substantial part of the image signal current can be directed to pass through one diode to form an information dependent on an illumination incident on the image point pick-up, while a given smaller part of the image signal current can be directed to constitute a reference current passing through the other diode and adjustable in accordance with the variations of the circuit components' characteristics, and of a resistor, the voltage established across this resistor owing to the image signal current being observable.

8. The device according to claim 6, wherein the voltage/frequency converter comprised in the means is based on the modified basic circuit, known in itself in the art, of the electric charge pump, where the input variable is a voltage, by the aid of which a variable pulse frequency can be produced.

9. The device according to claim 6, wherein the interaction network consists of channle-specific constant current sources and of capacitances connected between all channels.

10. The device according to claim 6, wherein the device comprises one pulse counter per image forming channel for counting the pulses of said second pulse signal, a counter for calculating a largest difference between the counting rates of the channels, means for comparing the count result representing said difference with a predetermined threshold value, and means for delivering a control signal, dependent on the result of comparison, further to a control system of the lift door.

11. The device according to claim 6, wherein the output of the device is so connected to a control system of the lift door that open time of the lift door can be prolonged as required on the basis of the image information received.

* * * * *